United States Patent [19]
Coleman, Jr.

[11] Patent Number: 5,850,366
[45] Date of Patent: Dec. 15, 1998

[54] MEMORY ARRAY HAVING DUMMY CELLS IMPLEMENTED USING STANDARD ARRAY CELLS

[75] Inventor: Donald J. Coleman, Jr., Plano, Tex.

[73] Assignee: Texas Instruments Incorporated, Dallas, Tex.

[21] Appl. No.: 899,424

[22] Filed: Jul. 24, 1997

[51] Int. Cl.$^6$ .............................. G11C 7/00; G11C 13/00
[52] U.S. Cl. ..................... 365/210; 365/203; 365/205; 365/206
[58] Field of Search .................................. 365/203, 205, 365/206, 210

[56] References Cited

U.S. PATENT DOCUMENTS

| | | | |
|---|---|---|---|
| 5,226,014 | 7/1993 | McManus | 365/210 |
| 5,299,165 | 3/1994 | Kimura et al. | 365/210 |
| 5,339,274 | 8/1994 | Dhong et al. | 365/203 |
| 5,475,642 | 12/1995 | Taylor | 365/203 |
| 5,477,484 | 12/1995 | Nakashima | 365/182 |
| 5,640,350 | 6/1997 | Iga | 365/210 |

*Primary Examiner*—Viet Q. Nguyen
*Attorney, Agent, or Firm*—Jacqueline J. Garner; W. James Brady, III; Richard L. Donaldson

[57] ABSTRACT

A memory array (10) implemented by an integrated circuit is provided. The memory array (10) includes a bank of standard array cells (12) arranged in rows and columns. The bank of standard array cells (12) includes a plurality of rows of array cells (14) operable to provide memory storage and a plurality of rows of dummy cells (16) operable to provide a reference voltage level. A row decode block (22) is coupled to the bank of standard array cells via a plurality of wordlines (18) which include array cell wordlines and dummy cell wordlines. A sense amplifier block (24) is coupled to the bank of standard array cells (12) via a plurality of bitlines (20). The sense amplifier block (24) includes a plurality of sense amplifiers (26) coupled to the bitlines. The memory array (10) is operable to charge the plurality of dummy cells (16) to a precharge voltage level during a bitline (20) precharge period such that the dummy cells (16) operate to provide a reference voltage and capacitive balance to the sense amplifiers (26) when sensing an array cell (14).

19 Claims, 3 Drawing Sheets

MEMORY ARRAY HAVING DUMMY CELLS IMPLEMENTED USING STANDARD ARRAY CELLS

TECHNICAL FIELD OF THE INVENTION

This invention relates in general to the field of electronic devices, and more particularly to a memory array having dummy cells implemented using standard array cells.

BACKGROUND OF THE INVENTION

Sensing circuits for memory arrays such as DRAM devices originated as dynamic NMOS cross coupled latches and have evolved into CMOS cross coupled latches as are used in many conventional DRAM memory devices. Due to the prior use of NMOS devices and the higher mobility of N-channel devices, cross coupled latch design typically favors N-channel devices.

In addition, there is a desire to keep power consumption low. The electrostatic energy needed to charge the bitlines of the memory array is generally the largest contributor to power consumption. Consequently, the bitline reference voltage is often maintained at $V_{DD}/2$.

In some conventional memory arrays, specially designed dummy cells have been used to provide the reference voltage. Conventional dummy cells implement both a precharge level and a discrimination level for the memory array cells. However, in many cell designs, it can be impractical to design a dummy cell that can be written with an arbitrary dummy cell reference voltage. This has caused the adoption of the click capacitor cell, which occupies less space, or has been used as support for not including any dummy cell in the memory array.

Conventional DRAM memory arrays have employed dummy cells on referenced bitlines for two purposes. By writing a known dummy cell reference voltage to the dummy cells, the exact discrimination level of the sense amplifier can be decoupled from the bitline precharge voltage. Second, by using a dummy cell whose capacitance closely matches that of an array cell, the bitline capacitance, which includes that of the array cell, can be made equal on the two sides of the sense amplifier.

In many cases, the dummy cell has been included as a part of the sense amplifier. However, because dummy cells use chip area, they have been viewed as a necessary evil. To keep the area consumed by the dummy cells small, one alternative has been the use of a click capacitor as a compromise for both discrimination level adjustment and bitline capacitance matching. Recently, some conventional DRAM memory array designs have eliminated dummy cells entirely.

The absence of dummy cells causes problems with memory arrays. Operating a sense amplifier for a memory array without a dummy cell builds a fixed value into the capacitive difference. This can require P- and N-channel matching to reduce the offset caused by the inherent bitline mismatch to a noise level characterized by the P- and N-channel beta ($\beta$) difference.

It is desirable to provide dummy cell functionality to a memory array without consuming large chip area and without having a specially designed dummy cell as is necessary in conventional memory arrays.

SUMMARY OF THE INVENTION

In accordance with the present invention, a memory array having dummy cells implemented using standard array cells is provided that substantially eliminates or reduces disadvantages and problems associated with previously developed memory arrays.

According to one embodiment of the present invention, a memory array implemented by an integrated circuit is provided. The memory array includes a bank of standard array cells arranged in rows and columns. The bank of standard array cells includes a plurality of rows of array cells operable to provide memory storage and a plurality of rows of dummy cells operable to provide a reference voltage level. A row decode block is coupled to the bank of standard array cells via a plurality of wordlines which include array cell wordlines and dummy cell wordlines. A sense amplifier block is coupled to the bank of standard array cells via a plurality of bitlines. The sense amplifier block includes a plurality of sense amplifiers coupled to the bitlines. The memory array is operable to charge the plurality of dummy cells to a precharge voltage level during a bitline precharge period such that the dummy cells operate to provide a reference voltage and capacitive balance to the sense amplifiers when sensing an array cell.

A technical advantage of the present invention is the use of a standard array cell to implement dummy cells for a memory array. This provides dummy cell functionality to a memory array without requiring a specifically designed dummy cell. In addition, dummy cells implemented using standard array cells add minimal area to the memory array. These dummy cells provide a balance of the capacitance of a selected bitline with minimal costs of chip area or design detail.

DETAILED DESCRIPTION OF THE INVENTION

Figure 1:
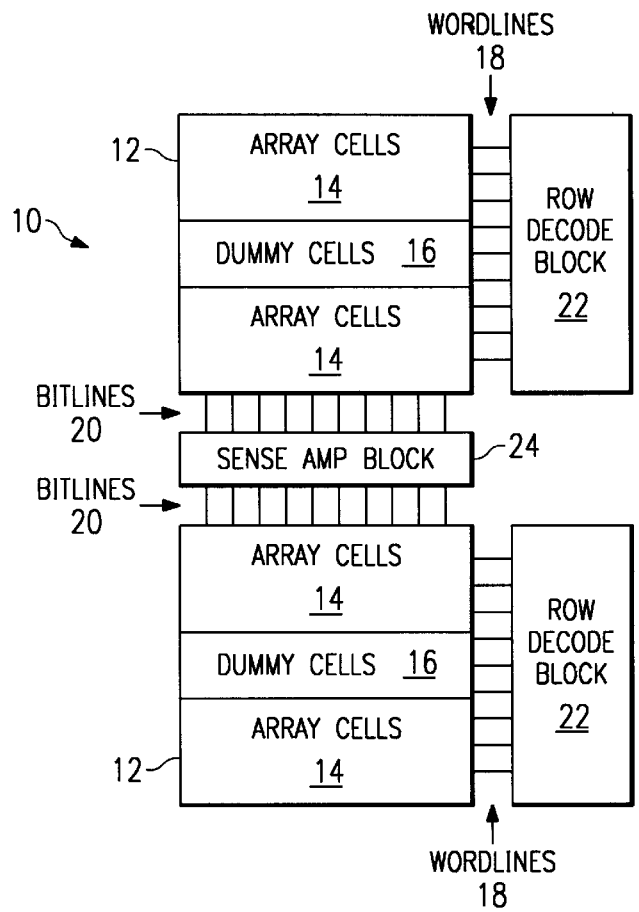
FIG. 1 is a block diagram of a memory array constructed according to the teachings of the present invention.

FIG. 1 is a block diagram of a memory array, indicated generally at 10, constructed according to the teachings of the present invention. Memory array 10 comprises a plurality of banks 12 of memory cells. Each bank 12 comprises array cells 14 and dummy cells 16. A plurality of wordlines 18 are connected to the rows of cells in each bank 12. Similarly, a plurality of bitlines 20 are coupled to the columns of cells in each bank 12. For each bank 12, row decode block 22 is coupled to and controls wordlines 18. A sense amplifier block 24 is coupled to and monitors bitlines 20.

In operation, memory array 10 provides data storage capacity in array cells 14. In one embodiment of the present invention, memory array 10 is a DRAM memory array. Row decode block 22 and sense amplifier block 24 provide addressability to write to and read from each array cell 14.

According to the teachings of the present invention, dummy cells 16 comprise rows of standard array cells used to implement dummy cells 16. Dummy cells 16 balance the capacitive load on sense amplifiers in sense amplifier block 24. Dummy cells 16 are charged to a precharge reference level according to timing diagrams shown in FIGS. 3A, 3B and 4B. Using standard array cells for dummy cells 16 allows the implementation of dummy cells in memory array 10 at a minimum cost of chip area and without requiring customized design elements for the dummy cells. As shown in FIG. 1, dummy cells 16 can be centered in bank 12. Other positioning of dummy cells 16 can also be implemented.

There has been movement in conventional memory array design to omit dummy cells. However, omission of dummy cells is contrary to implementing closely matched capacitive loads residing on the sense amplifiers (e.g., the drain nodes of cross coupled latches) to reduce the magnitude of the offset voltage (i.e., minimum signal required for faithful amplification). Dummy cells implemented using standard array cells provide this loading of the capacitance of the referenced bitline to substantially the same extent as an array cell loads the bitline.

Figure 2:
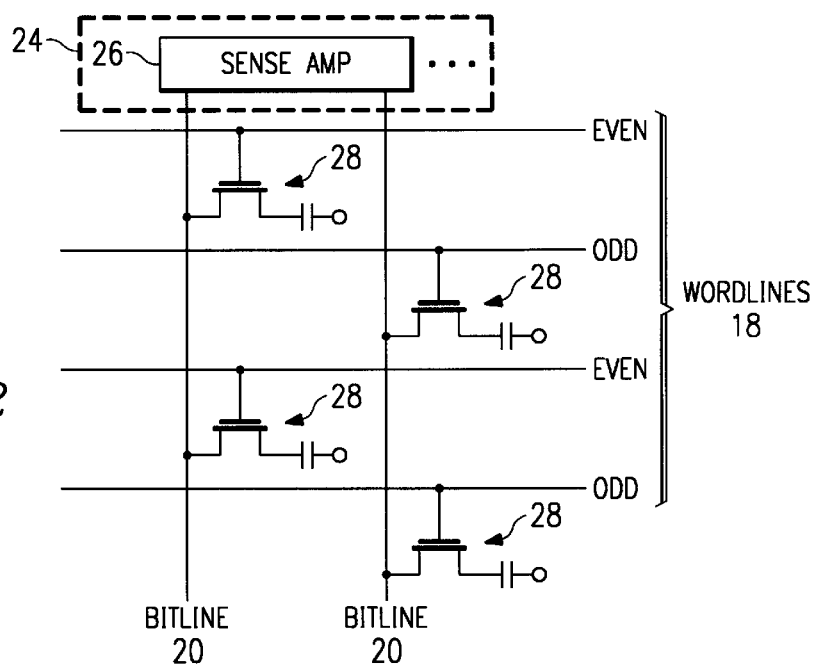
FIG. 2 is a circuit diagram of standard array cells in the memory array of FIG. 1.

FIG. 2 illustrates a circuit diagram of standard array cells in memory array 10. As shown, sense amplifier block 24 comprises a plurality of sense amplifiers 26. Each sense amplifier 26 can be coupled to two bitlines 20. Wordlines 18 cross bitlines 20 and can be designated as even and odd rows. Standard array cells 28 are connected to bitlines 20 and wordlines 18, as shown. In the illustrated embodiment, standard array cells 28 alternate such that adjacent bitlines 20 have even and odd cells connected thereto.

According to the teachings of the present invention, standard array cells 28 are used to implement both array cells 14 and dummy cells 16 of memory array 10. For a half pitch array as shown in FIG. 2, each bank 12 needs one even row and one odd row of standard array cells to implement dummy cells 16. These dummy cells 16 can be precharged to a reference level and thereby provide the reference level for each sense amplifier 26. When reading a state of an array cell 14, sense amplifier 26 compares the charge on that array cell 14 to the charge on a dummy cell 16 connected to the other bitline 20. Because dummy cells 16 are identical in construction to array cells 14, the bitline capacitances are balanced, and sense amplifier does not experience any offset due to an imbalance of capacitance.

Figure 3A:
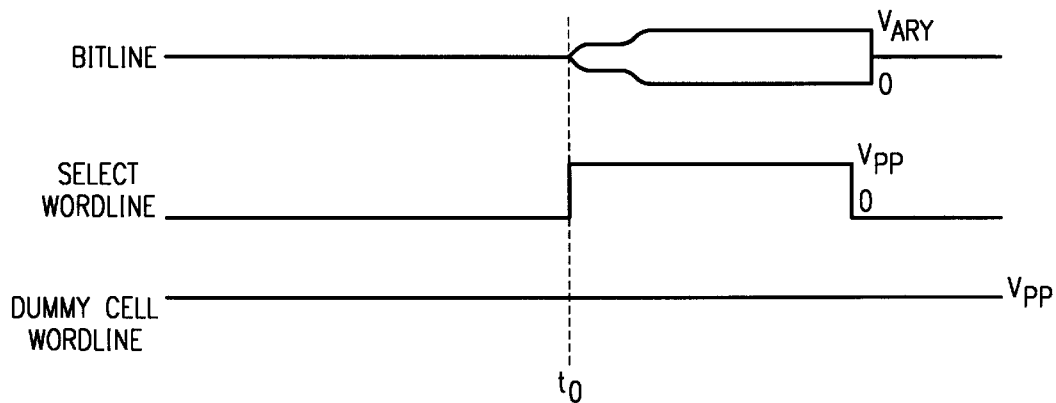
FIGS. 3A and 3B are timing diagrams for the operation of the memory array of FIG. 1 according to the teachings of the present invention.
Figure 3B:
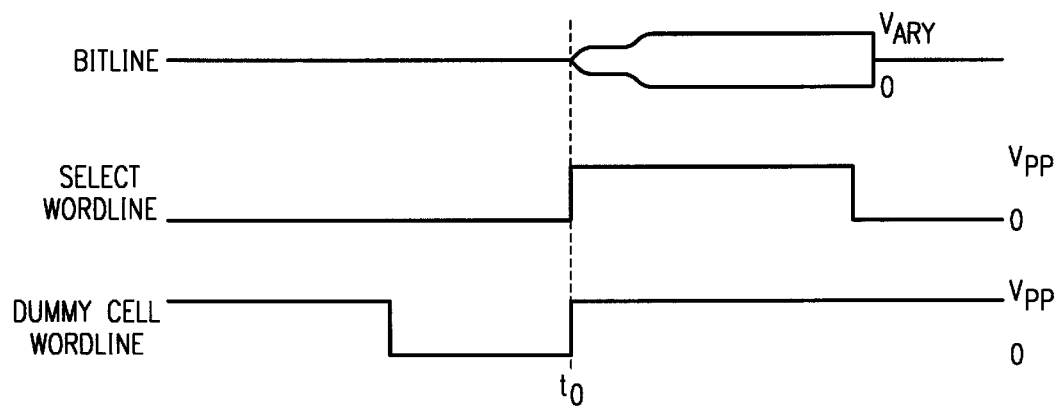

FIGS. 3A and 3B are timing diagrams for the operation of memory array 10 of FIG. 1 according to the teachings of the present invention. As shown in FIG. 3A, three signals are relevant to the precharging of dummy cells 16: the bitline signal, BITLINE; the select wordline signal, SELECT WORDLINE; and the dummy cell wordline signal, DUMMY CELL WORDLINE.

The bitline signal, BITLINE, begins at a value of one-half the maximum voltage of the array cells, $V_{ARY}$. The select wordline signal, SELECT WORDLINE, begins at zero voltage, and the dummy cell wordline signal, DUMMY CELL WORDLINE, remains charged to the maximum chip voltage of $V_{PP}$.

At a given point in time, $t_0$, the select wordline signal, SELECT WORDLINE, rises to a voltage level of $V_{PP}$ in order to select the appropriate wordline. When an array cell 14 is fully precharged and ready to be read, the bitline signal, BITLINE, will either rise to a value of $V_{ARY}$ or drop to a value of zero, as shown.

The dummy cell wordline signal, DUMMY CELL WORDLINE, remains high to charge dummy cell 16 and make dummy cell 16 available for use as a reference by sense amplifier 26. As can be seen, dummy cell 16 is charged during the precharge period of the bitline signal, BITLINE.

FIG. 3B shows a second embodiment of a timing diagram that also implements bitline-wordline coupling correction. The drop of the voltage level on the dummy cell wordline signal, DUMMY CELL WORDLINE, from $V_{PP}$ to zero preceding $t_0$, provides correction for bitline-wordline coupling. At time $t_0$, the dummy cell wordline signal, DUMMY CELL WORDLINE, is raised back to the voltage level $V_{PP}$.

It should be understood that the timing diagrams of FIG. 3A and FIG. 3B do not implement discrimination level control for dummy cells 16. However, both timing diagrams do implement charging of dummy cells 16 to provide a reference level for sense amplifiers 26 reading array cells 14 and to capacitively balance the bitline being read.

Figure 4A:
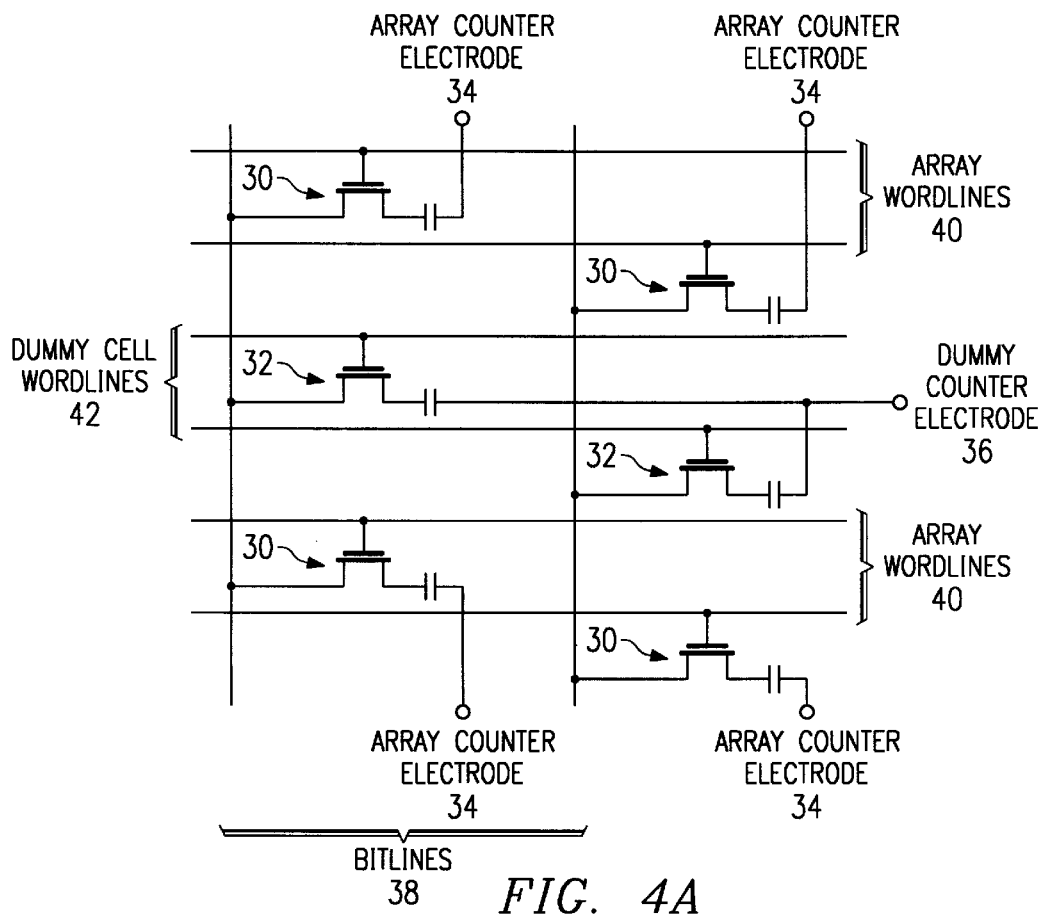
FIGS. 4A and 4B are a circuit diagram and a timing diagram for dummy cells and array cells in a memory array including counter electrodes to implement discrimination level control according to the teachings of the present invention.
Figure 4B:
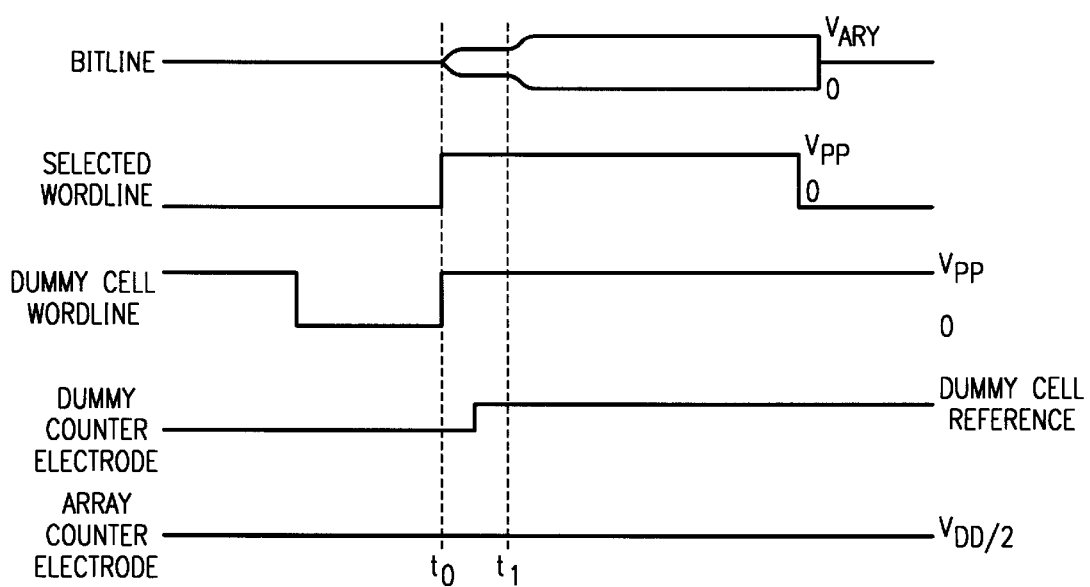

FIGS. 4A and 4B are a circuit diagram and a timing diagram for dummy cells and array cells in memory array 10 that include counter electrodes to implement discrimination level control according to the teachings of the present invention. As shown in FIG. 4A, the memory array comprises array cells 30 and dummy cells 32. Array cells 30 and dummy cells 32 comprise standard array cells. Array counter electrodes 34 are connected to array cells 30, and dummy cell counter electrode 36 is connected to dummy cell 32. As described before, bitlines 38 and array wordlines 40 are coupled to array cells 30. Similarly, bitlines 38 and dummy cell wordline 42 are coupled to dummy cell 32.

In operation, array counter electrodes 34 and dummy counter electrode 36 provide an ability to modify the charge on array cells 30 and dummy cells 32 to implement discrimination level control.

FIG. 4B is a timing diagram showing the use of array counter electrodes 34 and dummy counter electrode 36 to implement discrimination level control. As shown in FIG. 4B, the bitline signal, BITLINE, the selected wordline signal, SELECTED WORDLINE, and the dummy cell wordline signal, DUMMY CELL WORDLINE, operate the same as shown in FIG. 3B.

The dummy counter electrode signal, DUMMY COUNTER ELECTRODE, implements a change in voltage between time, $t_0$ and time, $t_1$, in order to modify the dummy cell reference voltage to allow discrimination level control. The array counter electrode signal, ARRAY COUNTER ELECTRODE, maintains a voltage level of $V_{DD}/2$ as appropriate for conventional use of array cell counter electrodes.

The timing diagram of FIG. 4B implements discrimination level control for the dummy counter electrodes 36 of FIG. 4A. In this manner, according to the present invention, it is possible to use dummy cells implemented using standard array cells to provide both a reference level and discrimination level control.

The use of rows of standard array cells from the memory array to implement dummy cells is a technical advantage of the present invention and provides benefits to DRAM memory arrays. The wordline for the row of dummy cells can be activated during the bitline precharge portion of the DRAM cycle. This activation of the dummy cell wordline causes the precharge voltage to be written to the selected dummy row of dummy cells. As shown in FIGS. 3B and 4B, the dummy wordline can be deselected prior to the wordline strobing.

When a selected wordline is made active, the bitlines complimentary to those bitlines receiving data from array cells can be charged by the row of dummy cells by concurrently activating the dummy wordline. There is no charge transferred to the complimentary bitline because the dummy cells were written to the precharge potential. During the sense amplifier activation part of the DRAM cycle, both sides of each sense amplifier drive an array cell and a dummy cell which have a substantially equal capacitance because any variance due to process parameters should be varied similarly throughout all standard array cells.

As described above, if a DRAM memory array permits electrically isolating the common counter electrode of the dummy cells from the common counter electrode of the array cells, as shown in FIG. 4A, it is possible to control the sense amplifier discrimination level and make it distinct and different from the bitline precharge voltage. The isolated common counter electrode of the dummy cells can be used as a click capacitor. The discrimination level achieved can differ from the bitline precharge voltage by the voltage step clicked onto the common dummy cell counter electrode.

If the common counter electrode cannot be isolated for the dummy cells, then a click capacitor could be added instead. In this second case, the discrimination level could be changed by an amount proportional to the voltage step applied to the click capacitor and to the ratio of the click to cell capacitance.

According to the teachings of the present invention, standard array cells can be used to implement dummy cells in a DRAM memory array. These dummy cells consume a small area to implement the dummy cell function and do not interrupt the regularity of the array.

In a DRAM memory array having a folded bitline design, each bitline segment may serve 128 cells and be crossed by 256 wordlines. With a half pitch array, implementation of the present invention would require each array segment of 256 wordlines to be expanded to 258 wordlines for two rows of dummy cells. This is less than a one percent increase in array area. In a quarter pitch array, implementation would require an additional four dummy wordlines for each bitline segment. Given an array efficiency of 60% and assuming that the addition of logic circuitry to drive the dummy wordlines requires negligible area, the chip size increase would remain less than one percent.

Depending on the array cell to bitline capacitance ratio, the capacitive mismatch caused by omission of dummy cells can be relatively large compared to the threshold mismatch of the latch pairs. A technical advantage of the present invention is the use of standard array cells to implement dummy cells at a small cost in chip area. Operationally, dummy cells are written to the bitline precharge voltage by activation of the dummy cell wordline in a non-standard timing sequence during the bitline precharge time, as shown in FIGS. 3A, 3B AND 4B. Minimal inclusion of dummy cells does not necessarily implement a secondary dummy cell function of adjustment of the discrimination level. As described above, the secondary function of discrimination level control can be implemented using either a click capacitor or an isolated dummy cell capacitor counter electrode.

Although the present invention has been described in detail, it should be understood that various changes, substitutions and alterations can be made hereto without departing from the spirit and scope of the invention as defined by the appended claims.

What is claimed is:

1. A memory array implemented by an integrated circuit, the memory array comprising:
   a bank of standard array cells arranged in rows and columns, comprising;
   a plurality of rows of array cells, the array cells operable to provide memory storage; and
   a plurality of rows of dummy cells, the dummy cells operable to provide a reference voltage level;
   a row decode block coupled to the bank of standard array cells via a plurality of wordlines, the wordlines comprising array cell wordlines and dummy cell wordlines; and
   a sense amplifier block coupled to the bank of standard array cells via a plurality of bitlines, the sense amplifier block comprising a plurality of sense amplifiers coupled to the bitlines;
   the memory array operable to charge the plurality of dummy cells to a precharge voltage level during a bitline precharge period such that the dummy cells operate to provide a reference voltage and capacitive balance to the sense amplifiers when sensing an array cell.

2. The memory array of claim 1, further comprising:
   a second bank of standard array cells arranged in rows and columns, comprising:
   a second plurality of rows of array cells, the array cells operable to provide memory storage; and
   a second plurality of rows of dummy cells, the dummy cells operable to provide a reference voltage level; and
   a row decode block coupled to the second bank of standard array cells via a plurality of wordlines, the wordlines comprising array cell wordlines and dummy cell wordlines;
   the memory array further operable to charge the second plurality of dummy cells to a precharge voltage level during a bitline precharge period such that the dummy cells operate to provide a reference voltage and capacitive balance to the sense amplifiers in the sense amplifier block when sensing an array cell of the second plurality of array cells.

3. The memory array of claim 1, wherein the memory array is operable to hold a voltage level of the dummy cell wordlines equal to a maximum chip voltage level.

4. The memory array of claim 1, wherein the memory array is operable to hold a voltage level of the dummy cell wordlines equal to a maximum integrated circuit voltage level, drop the voltage level of the dummy cell wordlines equal to zero volts immediately prior to an initiation of wordline strobe, and raise the voltage level of the dummy cell wordlines equal to the maximum integrated circuit voltage upon the initiation of wordline strobe.

5. The memory array of claim 1, further comprising:
   an array counter electrode coupled to each array cell; and
   a dummy cell counter electrode coupled to each dummy cell, the dummy cell counter electrode allow discrimination level control of the dummy cells.

6. The memory array of claim 1, further comprising:
   an array counter electrode coupled to each array cell; and
   a dummy cell counter electrode coupled to each dummy cell, the dummy cell counter electrode allow discrimination level control of the dummy cells;
   the memory array further operable to adjust a voltage level of the dummy cell counter electrode after wordline strobe.

7. The memory array of claim 1, wherein the memory array comprise a half pitch array, each sense amplifier is coupled to two bitlines, and the plurality of rows of dummy cells comprises two rows.

8. The memory array of claim 1, wherein the memory comprises a DRAM memory array.

9. A DRAM memory array implemented by an integrated circuit, the DRAM memory array comprising:

a bank of standard array cells arranged in rows and columns, comprising:
  a plurality of rows of array cells, the array cells operable to provide memory storage; and
  a plurality of rows of dummy cells, the dummy cells operable to provide a reference voltage level;
a row decode block coupled to the bank of standard array cells via a plurality of wordlines, the wordlines comprising array cell wordlines and dummy cell wordlines;
a sense amplifier block coupled to the bank of standard array cells via a plurality of bitlines, the sense amplifier block comprising a plurality of sense amplifiers coupled to the bitlines;
an array counter electrode coupled to each array cell; and
a dummy cell counter electrode coupled to each dummy cell, the dummy cell counter electrode allowing discrimination level control of the dummy cells;
the DRAM memory array operable to charge the plurality of dummy cells to a precharge voltage level during a bitline precharge period such that the dummy cells operate to provide a reference voltage and capacitive balance to the sense amplifiers when sensing an array cell, and further operable to adjust a voltage level of the dummy cell counter electrode after wordline strobe to allow discrimination level control.

10. The memory array of claim 9, further comprising:
a second bank of standard array cells arranged in rows and columns, comprising:
  a second plurality of rows of array cells, the array cells operable to provide memory storage; and
  a second plurality of rows of dummy cells, the dummy cells operable to provide a reference voltage level; and
a row decode block coupled to the second bank of standard array cells via a plurality of wordlines, the wordlines comprising array cell wordlines and dummy cell wordlines;
an array counter electrode coupled to each array cell; and
a dummy cell counter electrode coupled to each dummy cell, the dummy cell counter electrode allowing discrimination level control of the dummy cells;
the memory array further operable to charge the second plurality of dummy cells to a precharge voltage level during a bitline precharge period such that the dummy cells operate to provide a reference voltage and capacitive balance to the sense amplifiers in the sense amplifier block when sensing an array cell of the second plurality of array cells.

11. The memory array of claim 9, wherein the memory array is operable to hold a voltage level of the dummy cell wordlines equal to a maximum chip voltage level.

12. The memory array of claim 9, wherein the memory array is operable to hold a voltage level of the dummy cell wordlines equal to a maximum integrated circuit voltage level, drop the voltage level of the dummy cell wordlines equal to zero volts immediately prior to an initiation of wordline strobe, and raise the voltage level of the dummy cell wordlines equal to the maximum integrated circuit voltage upon the initiation of wordline strobe.

13. The memory array of claim 9, wherein the memory array is further operable to adjust a voltage level of the dummy cell counter electrode after wordline strobe.

14. The memory array of claim 9, wherein the memory array comprise a half pitch array, each sense amplifier is coupled to two bitlines, and the plurality of rows of dummy cells comprises two rows.

15. The memory array of claim 9, wherein the memory comprises a DRAM memory array.

16. A method for constructing a memory array in an integrated circuit, comprising:
forming a bank of standard array cells arranged in rows and columns such that the standard array cells include a plurality of rows of array cells operable to provide memory storage and includes a plurality of rows of dummy cells operable to provide a reference voltage level;
connecting a row decode block to the bank of standard array cells via a plurality of wordlines where the wordlines comprise array cell wordlines and dummy cell wordlines;
connecting a sense amplifier block to the bank of standard array cells via a plurality of bitlines where the sense amplifier block es a plurality of sense amplifiers coupled to the bitlines; and
charging the plurality of dummy cells to a precharge voltage level during a bitline precharge period such that the dummy cells provide a reference voltage and capacitive balance to the sense amplifiers when sensing an array cell.

17. The method of claim 16, wherein charging comprises:
holding a voltage level of the dummy cell wordlines equal to a maximum integrated circuit voltage level;
dropping the voltage level of the dummy cell wordlines equal to zero volts immediately prior to an initiation of wordline strobe; and
raising the voltage level of the dummy cell wordlines equal to the maximum integrated circuit voltage upon the initiation of wordline strobe.

18. The method of claim 16, further comprising:
connecting an array counter electrode to each array cell; and
connecting a dummy cell counter electrode to each dummy cell where the dummy cell counter electrode allows discrimination level control of the dummy cells.

19. The method of claim 16, further comprising:
connecting an array counter electrode to each array cell;
connecting a dummy cell counter electrode to each dummy cell where the dummy cell counter electrode allow discrimination level control of the dummy cells; and
adjusting a voltage level of the dummy cell counter electrode after wordline strobe.

* * * * *